United States Patent
Nicolai et al.

(10) Patent No.: US 6,488,214 B1
(45) Date of Patent: Dec. 3, 2002

(54) CONTROL CABINET

(75) Inventors: Walter Nicolai, Buseck; Adam Pawlowski, Eschenburg-Wissenbach; Stefan Schneider, Bad Endbach, all of (DE)

(73) Assignee: Rittal-Werk Rudolf Loh GmbH & Co. KG, Herborn (DE)

(*) Notice: Subject to any disclaimer, the term of this patent is extended or adjusted under 35 U.S.C. 154(b) by 0 days.

(21) Appl. No.: 09/601,760

(22) PCT Filed: Dec. 24, 1998

(86) PCT No.: PCT/EP98/08450

§ 371 (c)(1),
(2), (4) Date: Aug. 7, 2000

(87) PCT Pub. No.: WO99/40659

PCT Pub. Date: Aug. 12, 1999

(30) Foreign Application Priority Data

Feb. 7, 1998 (DE) .......................................... 198 04 901

(51) Int. Cl.[7] ................................................. F24D 5/10
(52) U.S. Cl. .......................... 237/69; 361/695; 361/694; 165/80.2
(58) Field of Search .................................. 454/184, 185; 361/695, 694; 174/16.1; 237/69, 14

(56) References Cited

FOREIGN PATENT DOCUMENTS

| DE | 37 10566 | 10/1988 |
|---|---|---|
| DE | 41 35 894 | 11/1992 |
| DE | 93 15 017 | 4/1994 |
| DE | 43 13 022 | 5/1994 |
| DE | 196 09 794 | 9/1997 |

*Primary Examiner*—Harold Joyce
*Assistant Examiner*—Derek S. Boles
(74) *Attorney, Agent, or Firm*—Pauley Petersen Kinne & Erickson

(57) ABSTRACT

A control cabinet having a cabinet body with opened sides which can be closed at least partially by one or more side walls. An air conditioning device which is placed near at least one side wall rejects heat generated inside the cabinet body or guides it towards the inside of the cabinet body. This invention simplifies the design of the air conditioning device. For this purpose, an intermediate wall which is parallel to the side wall and located at a distance therefrom, is placed in such a way that it is oriented towards the inside of the cabinet body. In addition, the air conditioning device is placed in the intermediate space surrounded by the side wall and the intermediate wall.

12 Claims, 1 Drawing Sheet

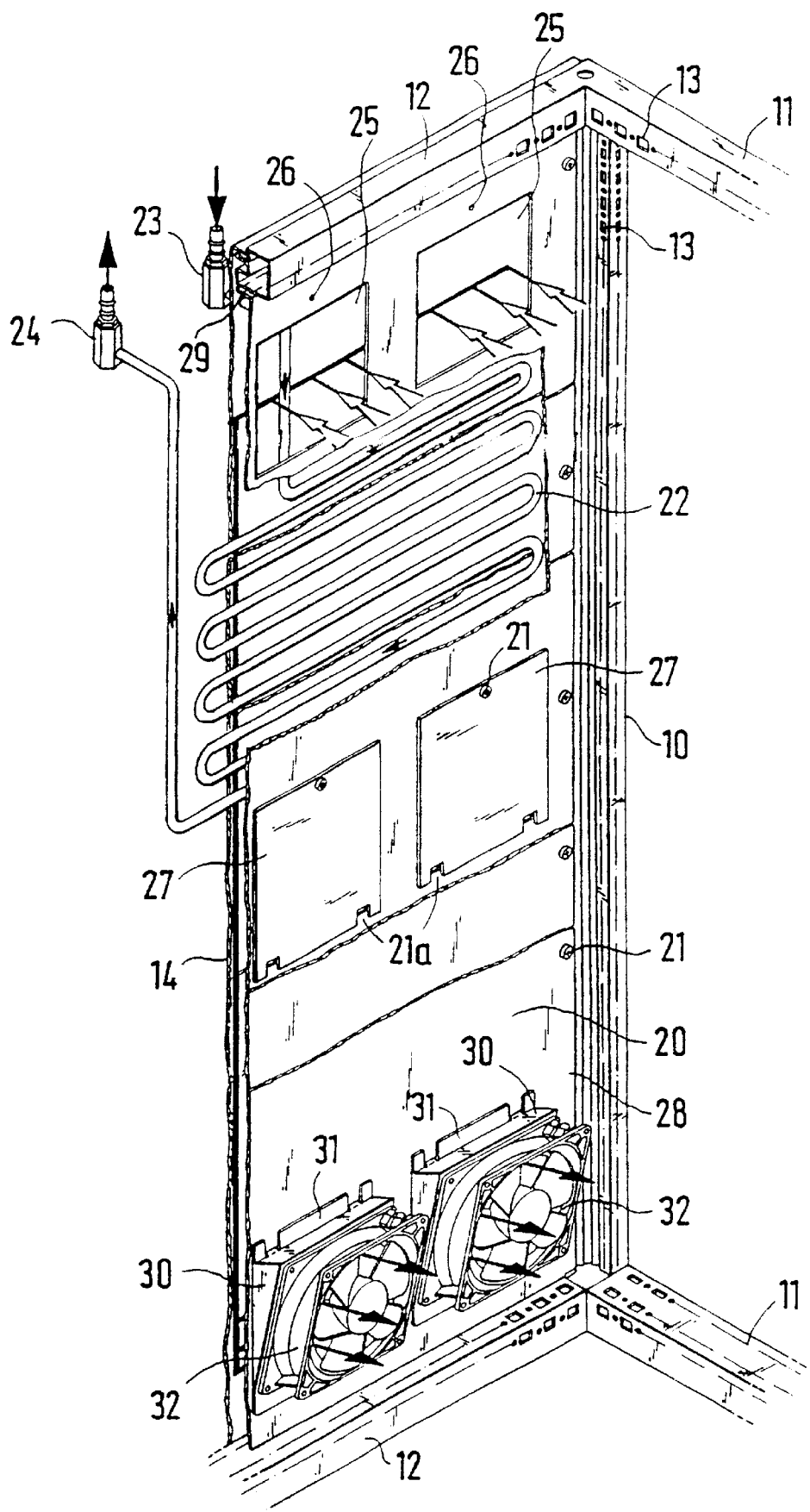

CONTROL CABINET

BACKGROUND OF THE INVENTION

1. Field of the Invention

This invention relates to a switchgear cabinet with a cabinet body, a body having open sides that can be closed off at least partially by one or several lateral walls, wherein an air conditioning unit is arranged in an area of at least one lateral wall, through which heat can be removed from or supplied to the cabinet body.

2. Description of Prior Art

Such a cabinet body is known from German Patent Reference DE 41 35 894 C1. As the air conditioning unit, this switchgear cabinet has a cooling unit having fans and heat exchangers. The cooling unit is arranged in a housing, which is inserted into a cutout in a vertical lateral wall. In order to retrofit an existing switchgear cabinet with the cooling unit, it is necessary to rework the appropriate lateral wall, or respectively to install a new one.

An air conditioning arrangement is known from German Patent Reference DE 43 13 022, which is installed on an exterior of the lateral wall. The lateral wall has appropriate openings for a spatial connection with an interior of the switchgear cabinet.

German Patent Reference DE 37 10 566 C2 describes an air conditioning unit which is placed on the lateral wall which is embodied as a sheet metal cover. It is necessary, in a manner similar to the teachings of German Patent Reference DE 43 13 022, to cut out openings from the sheet metal cover.

SUMMARY OF THE INVENTION

It is one object of this invention to provide a switchgear cabinet of the type previously mentioned, which can be easily equipped with an air conditioning unit.

This object is achieved with an intermediate wall arranged parallel and spaced apart from the lateral wall and facing the interior of the cabinet body. The air conditioning unit is arranged in the space enclosed by the lateral wall and the intermediate wall.

With this design in accordance with the invention of a switchgear cabinet, the lateral wall becomes a part of the air conditioning unit, so that the cost for parts can be considerably reduced. The outer geometry of the switchgear cabinet is not changed by the installation of the air conditioning unit which, for one, offers advantages in appearance. Furthermore, it is thus possible to take limited space conditions in the surroundings of the switchgear cabinet into consideration. Because the cooling device is associated with the lateral wall it is also possible to transfer heat with the environment directly through the area of the lateral wall. This results in good efficiency of the cooling device.

In one preferred embodiment of this invention, the cabinet body has a rack of vertical profiled frame sections and horizontal depth and width struts. The intermediate wall and the lateral wall are fastened to the rack, and the width of the intermediate space extending vertically with respect to the lateral wall is equal to or less than the corresponding vertical profiled frame sections or the depth, or respectively the width struts. The air conditioning unit thus designed hardly reduces the interior of the switchgear cabinet, so that the installation space for built-in units is only slightly reduced. In particular, the vertical profiled frame sections can still be used as attachment points for built-in units.

For example, the air conditioning unit can be designed as a heat exchanger. In that case the intermediate wall has one or several openings, through which air from the interior of the switchgear cabinet is conducted to the heat exchanger. Thereafter, the conditioned air can again be returned into the interior of the switchgear cabinet.

Thus the heat exchanger has a conduit system arranged in a meander shape, through which coolant is conducted and whose cooling surfaces face the intermediate space formed between the intermediate and the lateral walls. The conduit system is connected via connecting elements to a supply unit arranged outside of the switchgear cabinet. Effective cooling of the air can take place against the meander-shaped conduit system. The conduit sections of the conduit system which are arranged crosswise to the flow direction are preferably arranged offset from each other, vertically in relation to the lateral wall. The flowing air is deflected several times by this simple step to achieve an optimal flow around the conduit sections.

Another embodiment of this invention is distinguished because the vertical intermediate wall has in its upper area the openings embodied as inlet openings, and the intermediate wall supports one or several fans in its lower area, which draw the air out of the intermediate space and return the air into the interior of the cabinet body. Air then flows again back into the intermediate space through the inlet openings.

In accordance with a preferred embodiment of this invention, the intermediate wall has two or more rows of openings, and the openings are arranged symmetrically with respect to a center transverse axis and a center longitudinal axis extending in a plane of the intermediate wall. For one, a simplification of mounting is thus achieved, and it is possible to achieve an even air flow and guidance in many variations by even distribution of the openings.

BRIEF DESCRIPTION OF THE DRAWING

This invention will be explained in greater detail in what follows by an exemplary embodiment represented in the drawing which shows a rack of a switchgear cabinet in a partial perspective side view.

DESCRIPTION OF PREFERRED EMBODIMENTS

The rack has a bottom frame and a top frame with horizontal depth and width struts 11 and 12. The bottom frame is connected by means of vertical profiled frame sections 10 with the top frame. Both the vertical profiled frame sections 10 and the depth and width struts 11 and 12 have fastening receivers 13 spaced apart at even distances from each other.

The rack can be enclosed by vertical and horizontal lateral walls 14 and at least one cabinet door. The lateral wall is made of sheet steel and thus has good heat conductivity.

Only one lateral wall 14 is shown in the drawings for reasons of clarity. An intermediate wall 20 is arranged parallel with it and faces the interior of the switchgear cabinet. The intermediate wall 20 can be screwed with its vertical edges 28 to the fastening receivers 13 of the vertical profiled frame sections 28, such as with fastening screws 21. An air collection channel is formed between the lateral wall 14 and the intermediate wall 20. An air conditioning unit, embodied as a heat exchanger, is installed in this air collection channel, which is preferably formed by a fluid conduit conducted in a meander shape. The fluid conduit is conducted out of the air collection channel through the lateral wall 14 by means of two conduit elements. The fluid conduit can be connected there to a cooling system via connecting elements 23, 24. The air collection channel is spatially connected via openings 25 in the intermediate wall 20 with the interior of the switchgear cabinet. In this case the openings 25 are arranged in horizontally extending rows, which are arranged in different horizontal planes. One row is arranged in the upper roof area, one in the lower bottom area and one in the center area of the intermediate wall 20. Preferably, the intermediate wall 20 is constructed symmetrically, so that a simplification of mounting can be achieved. The openings 25 can be selectively closed off by means of cover plates 27. In the embodiment shown, the openings 25 of the center row are closed off. The cover plates 27 have hook elements 21a for their attachment, which can be hung in the lower horizontal edge of the openings 25. The cover plates 25 can then be screwed to the intermediate wall 20 in the area of the upper horizontal edge.

Fans 32 are arranged on the lower openings 25 and are screwed to adapters 30, which can be fixed in place on the opening 25 by means of a fastening plate 31.

The fans 32 draw air out of the air collection channel and discharge the air into the interior of the switchgear cabinet. At the same time, heated air flows out of the roof area of the switchgear cabinet through the upper openings 25 into the air collection channel. The heated air passes along the air conditioning unit 22, where it is cooled. The horizontal conduit sections are preferably arranged offset from each other, crosswise to the flow direction. The air can then flow around them, so that an effective use of the cooling output becomes possible. After the air conditioning unit 22, the cooled air is again supplied to the interior of the switchgear cabinet by means of the fans 32.

The lateral wall 14 is used as an additional heat exchanger, through which a heat exchange with the surroundings over a large surface is possible. A high degree of efficiency can be achieved by means of the air conditioning unit 22 in this way.

This invention is not only limited to the exemplary embodiment represented in the drawing. It would also be conceivable to install the air conditioning unit between the center and lower rows of openings 25. A further air conditioning unit 22 can also be installed.

It is also possible to install the fans 32 at the upper openings 25, wherein they then discharge air out of the interior of the switchgear cabinet into the air collection channel.

A variety of courses for the flow are possible because of the arrangement of the openings 25, so that a directed conditioning of the interior of the switchgear cabinet is possible.

If a switchgear cabinet is set up in cold surroundings, the air conditioning unit of this invention can also be employed for heating the interior of the switchgear cabinet. In this case a heating coil, for example, is installed in the air collection channel.

What is claimed is:

1. In a switchgear cabinet having a cabinet body with open sides that can be closed off at least partially by at least one lateral wall, wherein an air conditioning unit is arranged in an area of at least one lateral wall, through which heat is transferred to the cabinet body, the improvement comprising:

an intermediate wall (20) arranged parallel and spaced apart from the at least one lateral wall (14) and facing an interior of the cabinet body, the cabinet body having a rack of a plurality of vertical profiled frame sections (10), horizontal depth struts (11) and horizontal width struts (12), the intermediate wall (20) and the at least one lateral wall (14) fastened to the rack, and a width of an intermediate space extending vertically with respect to the at least one lateral wall (14) being one of equal to and less than at least one of the corresponding vertical profiled frame sections (10) or the horizontal depth struts (11), and the horizontal width struts (12), and the air conditioning unit (22) arranged in a space enclosed by the at least one lateral wall (14) and the intermediate wall (20), the air conditioning unit (22) being a heat exchanger, the intermediate wall (20) having at least one opening (25) through which air from the interior of the cabinet body is conducted to the heat exchanger, and the air conditioned at the heat exchanger returned into the interior of the cabinet body through at least one opening.

2. In a switchgear cabinet having a cabinet body with open sides that can be closed off at least partially by at least one lateral wall, wherein an air conditioning unit is arranged in an area of at least one lateral wall, through which heat is transferred to the cabinet body, the improvement comprising:

an intermediate wall (20) arranged parallel and spaced apart from the at least one lateral wall (14) and facing an interior of the cabinet body, the cabinet body having a rack of a plurality of vertical profiled frame sections (10), horizontal depth struts (11) and horizontal width struts (12), the intermediate wall (20) and the at least one lateral wall (14) fastened to the rack, and a width of an intermediate space extending vertically with respect to the at least one lateral wall (14) being one of equal to and less than at least one of the corresponding vertical profiled frame sections (10) or the horizontal depth struts (11), and the horizontal width struts (12), and the air conditioning unit (22) arranged in a space enclosed by the at least one lateral wall (14) and the intermediate wall (20), the vertical intermediate (20) wall having in an upper area inlet openings (25), and the intermediate wall (20) supporting at least one fan (32) in a lower area which draws the air out of the intermediate space and returns the air into the interior of the cabinet body.

3. In the switchgear cabinet in accordance with claim 2, wherein the air conditioning unit (22) is a heat exchanger, the intermediate wall (20) has at least one opening (25) through which air from the interior of the cabinet body is conducted to the heat exchanger, and the air conditioned at the heat exchanger is returned into the interior of the cabinet body through at least one opening.

4. In the switchgear cabinet in accordance with claim 3, wherein the heat exchanger has a conduit system arranged in a meander shape through which coolant is conducted and has a plurality of cooling surfaces facing the intermediate space, and the conduit system is connected via connecting elements (23, 24) to a supply unit outside of the switchgear cabinet.

5. In the switchgear cabinet in accordance with claim 4, wherein the conduit system has a plurality of conduit sections which are arranged crosswise to a flow direction, and a plurality of adjoining conduit sections are arranged offset from each other vertically with respect to the lateral wall (14).

6. In the switchgear cabinet in accordance with claim 1, wherein the vertical intermediate (20) wall has in an upper area inlet openings (25), and the intermediate wall (20) supports at least one fan (32) in a lower area which draws the air out of the intermediate space and returns the air into the interior of the cabinet body.

7. In the switchgear cabinet in accordance with claim 5, wherein the vertical intermediate (20) wall has in an upper area inlet openings (25), and fans (32) are assigned to the inlet openings (25) which draw the air out of the interior of the cabinet body and return the air into the intermediate space.

8. In the switchgear cabinet in accordance with claim 7, wherein the intermediate wall (20) has at least two rows of openings (25), and the openings (25) are arranged symmetrically with respect to a center transverse axis and a center longitudinal axis extending in a plane of the intermediate wall (20).

9. In the switchgear cabinet in accordance with claim 1, wherein the heat exchanger has a conduit system arranged in a meander shape through which coolant is conducted and has a plurality of cooling surfaces facing the intermediate space, and the conduit system is connected via connecting elements (23, 24) to a supply unit outside of the switchgear cabinet.

10. In the switchgear cabinet in accordance with claim 9, wherein the conduit system has a plurality of conduit sections which are arranged crosswise to a flow direction, and a plurality of adjoining conduit sections are arranged offset from each other vertically with respect to the lateral wall (14).

11. In the switchgear cabinet in accordance with claim 1, wherein the vertical intermediate (20) wall has in an upper area inlet openings (25), and fans (32) are assigned to the inlet openings (25) which draw the air out of the interior of the cabinet body and return the air into the intermediate space.

12. In the switchgear cabinet in accordance with claim 1, wherein the intermediate wall (20) has at least two rows of openings (25), and the openings (25) are arranged symmetrically with respect to a center transverse axis and a center longitudinal axis extending in a plane of the intermediate wall (20).

* * * * *